US 7,401,314 B1

(12) United States Patent
Schabas et al.

(10) Patent No.: US 7,401,314 B1
(45) Date of Patent: Jul. 15, 2008

(54) METHOD AND APPARATUS FOR PERFORMING COMPOUND DUPLICATION OF COMPONENTS ON FIELD PROGRAMMABLE GATE ARRAYS

(75) Inventors: Karl Schabas, Toronto (CA); Stephen Brown, Toronto (CA); Deshanand Singh, Mississauga (CA); Terry Borer, Toronto (CA); Shawn Malhotra, Windsor (CA)

(73) Assignee: Altera Corporation, San Jose, CA (US)

( * ) Notice: Subject to any disclaimer, the term of this patent is extended or adjusted under 35 U.S.C. 154(b) by 292 days.

(21) Appl. No.: 11/148,588

(22) Filed: Jun. 9, 2005

(51) Int. Cl.
G06F 17/50 (2006.01)
(52) U.S. Cl. .......................................... 716/16; 716/18
(58) Field of Classification Search ............. 716/16–18, 716/2, 4
See application file for complete search history.

(56) References Cited

U.S. PATENT DOCUMENTS

| | | | | |
|---|---|---|---|---|
| 6,708,325 B2 * | 3/2004 | Cooke et al. | ................ | 717/124 |
| 7,028,281 B1 * | 4/2006 | Agrawal et al. | ................ | 716/12 |
| 7,111,110 B1 * | 9/2006 | Pedersen | .................... | 711/104 |
| 7,191,426 B1 * | 3/2007 | Singh et al. | .................... | 716/16 |
| 7,219,048 B1 * | 5/2007 | Xu | .............................. | 703/19 |
| 2002/0157071 A1 * | 10/2002 | Schiefele et al. | ............... | 716/6 |

OTHER PUBLICATIONS

Schabas, K. et al., "Usign logic duplication to improve performance in FPGAs", Feb. 2003, ACM, pp. 136-142.*
Marquardt, A., et al., "Using cluster-based logic blocks and timing-driven packing to improve FPGA speed and density", 1999. ACM, pp. 37-46.*

* cited by examiner

Primary Examiner—Stacy Whitmore
(74) Attorney, Agent, or Firm—L. Cho (57) ABSTRACT

A method for designing a system on a target device utilizing field programmable gate arrays (FPGAs) includes duplicating a plurality of components in response to slack values associated with connections to the components in placement locations.

22 Claims, 7 Drawing Sheets

METHOD AND APPARATUS FOR PERFORMING COMPOUND DUPLICATION OF COMPONENTS ON FIELD PROGRAMMABLE GATE ARRAYS

TECHNICAL FIELD

The present invention relates to the field of field programmable gate arrays (FPGAs). More specifically, the present invention relates to a method and apparatus for performing compound duplication on timing driven FPGAs using tools such as electronic design automation (EDA) tools.

BACKGROUND

FPGAs may be used to implement large systems that include millions of gates and megabits of embedded memory. Of the tasks required in managing and optimizing a design, placement of components on the FPGAs and routing connections between components on the FPGA utilizing available resources can be the most challenging and time consuming. In order to satisfy placement and timing specifications, several iterations are often required to determine how components are to be placed on the target device and which routing resources to allocate to the components. The complexity of large systems often requires the use of EDA tools to manage and optimize their design onto physical target devices. Automated placement and routing algorithms in EDA tools perform the time consuming task of placement and routing of components onto physical devices.

Traditional duplication procedures performed after placement identified sufficiently long and critical connections between nodes or components in a system. For each connection identified, a determination would be made as to whether duplicating the source of the connection and placing it closer to its destination would improve the overall slack of the system. Although these procedures yielded some positive results, the procedures failed to recognize situations where duplication of a group of components would be beneficial when duplication of a single component in the group alone would not be beneficial.

Thus, what is needed is a method and apparatus for performing compound on on FPGAs.

SUMMARY

According to an embodiment of the present invention, a compound duplication technique is disclosed which considers whether to duplicate a chain of logic elements (LEs) onto a single logic array block (LAB). This technique recognizes situations where duplication of a plurality of LEs may yield beneficial results where duplication of a single LE would otherwise yield poor results. According to one embodiment, a first combinatorial LE that feeds a registered LE in a different LAB is identified. LEs that drive the first combinatorial LE and that reside in the same LAB are identified as being in the chain of LEs to be duplicated.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

Figure 1:
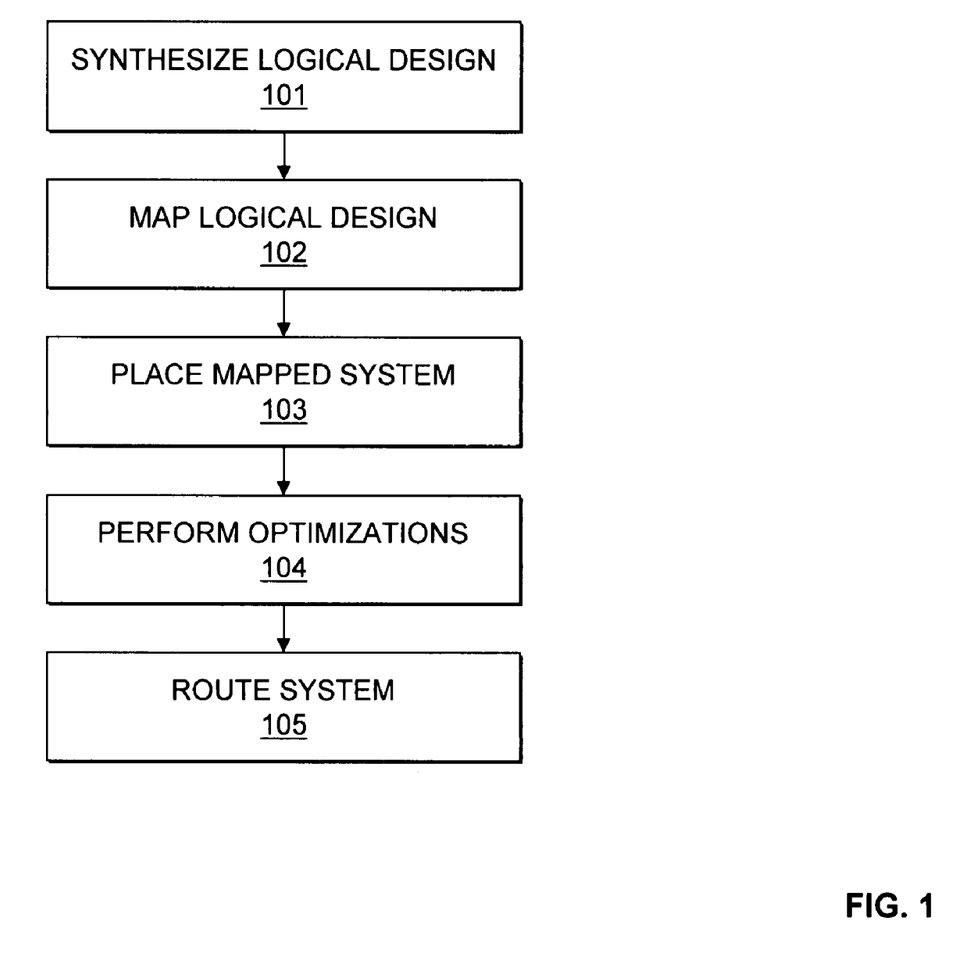
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
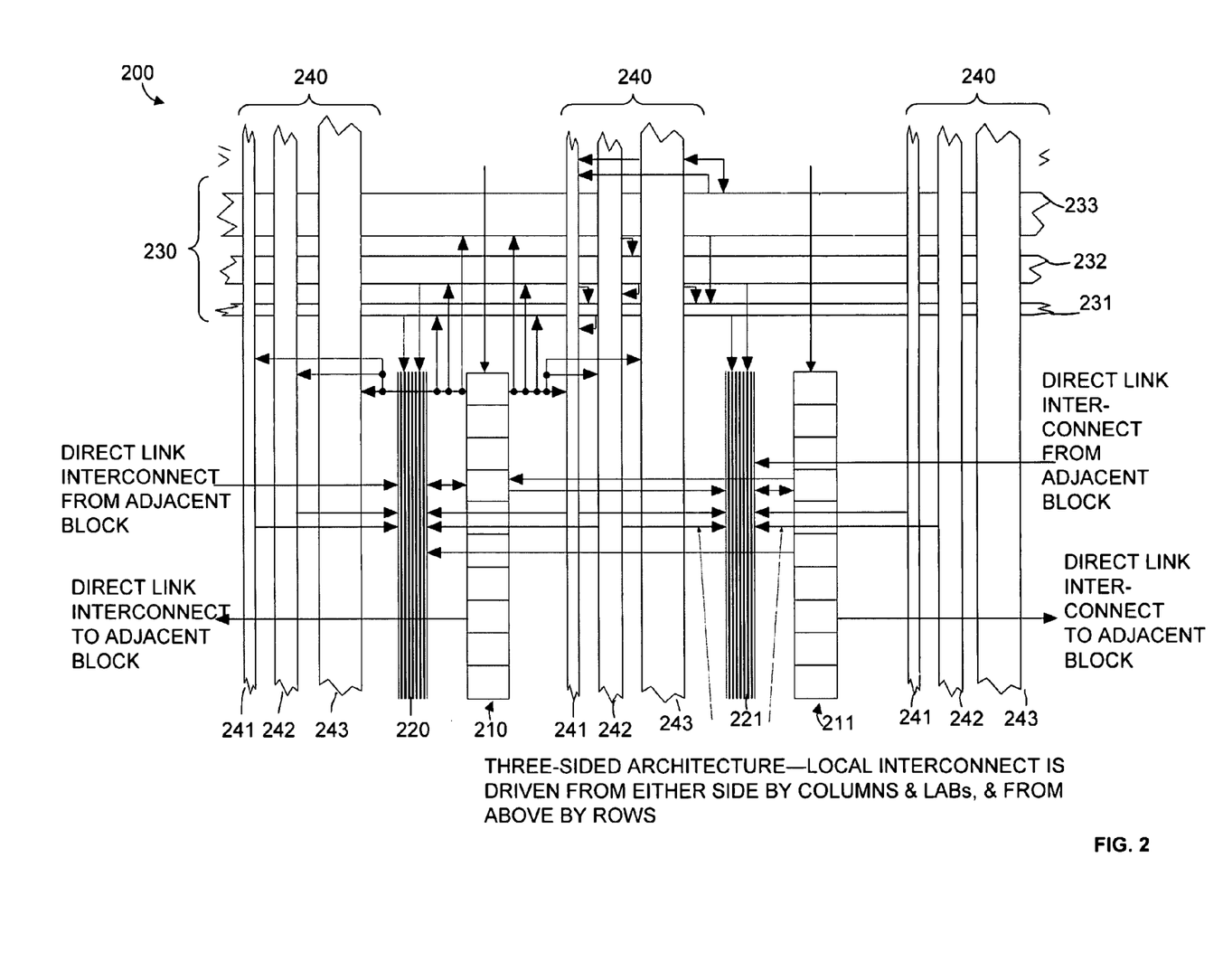
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Referring back to FIG. 1, at 102, the optimized logical design of the signal is mapped. Mapping includes determining how to implement components such as logic gates and other logic components (combinatorial logic) in the optimized logic representation with resources available on a target device. According to an embodiment of the present invention, a netlist is generated from mapping. The netlist illustrates how the resources of the target device are utilized to implement the system. The netlist may, for example, include a representation of the components on the target device and how the components are connected. Mapping may include, for example, determining how components may be implemented using LEs. The components may include, for example, digital logic such as logic gates, memory devices, and/or other components. Mapping may also include, for example, determining which LEs should be packed together in a LAB. Although the resources on a target device are assigned for implementing the components, the specific resources and their locations are not assigned in 102.

At 103, the mapped logical system design is placed. Placement includes fitting the system on the target device by determining which resources (and their location) on the target device is to be used for specific components and connections between the components. The placement procedure may be performed by a placer in an EDA tool that utilizes placement algorithms. According to an embodiment of the present invention, a user (designer) may provide input to the placer by specifying placement constraints. The constraints may include defining logic regions that group certain components of a system together. The size of the logic regions may be determined by the user or by a sizing method. The placement of the logic regions may be determined by the user or by a placement method.

At 104, layout-driven optimizations are performed. According to an embodiment of the present invention, routing delays for the connections on the netlist are estimated by calculating a fastest possible route. Timing-driven netlist optimization techniques may be applied to perturb the netlist to reduce the critical path(s). The timing-driven netlist optimization techniques include performing compound duplication. Compound duplication involves identifying a plurality of components (candidate chain) in the system to duplicate and to move together. The result of the duplication is evaluated to determine whether the overall slack of the connections will be negatively impacted. According to one embodiment, the amount of slack gained by placing the duplicated components closer to a destination component is determined as well as the slack change that arises due to the fact that some source components must drive the duplicate components. If duplicating the plurality of the components improves the slack of the system, the duplication is performed.

At 105, routing of the system is performed. During routing, routing resources on the target device are allocated to provide interconnections between logic gates, logic elements, and other components on the target device. The routing procedure may be performed by a router in an EDA tool that utilizes routing algorithms.

Figure 3:
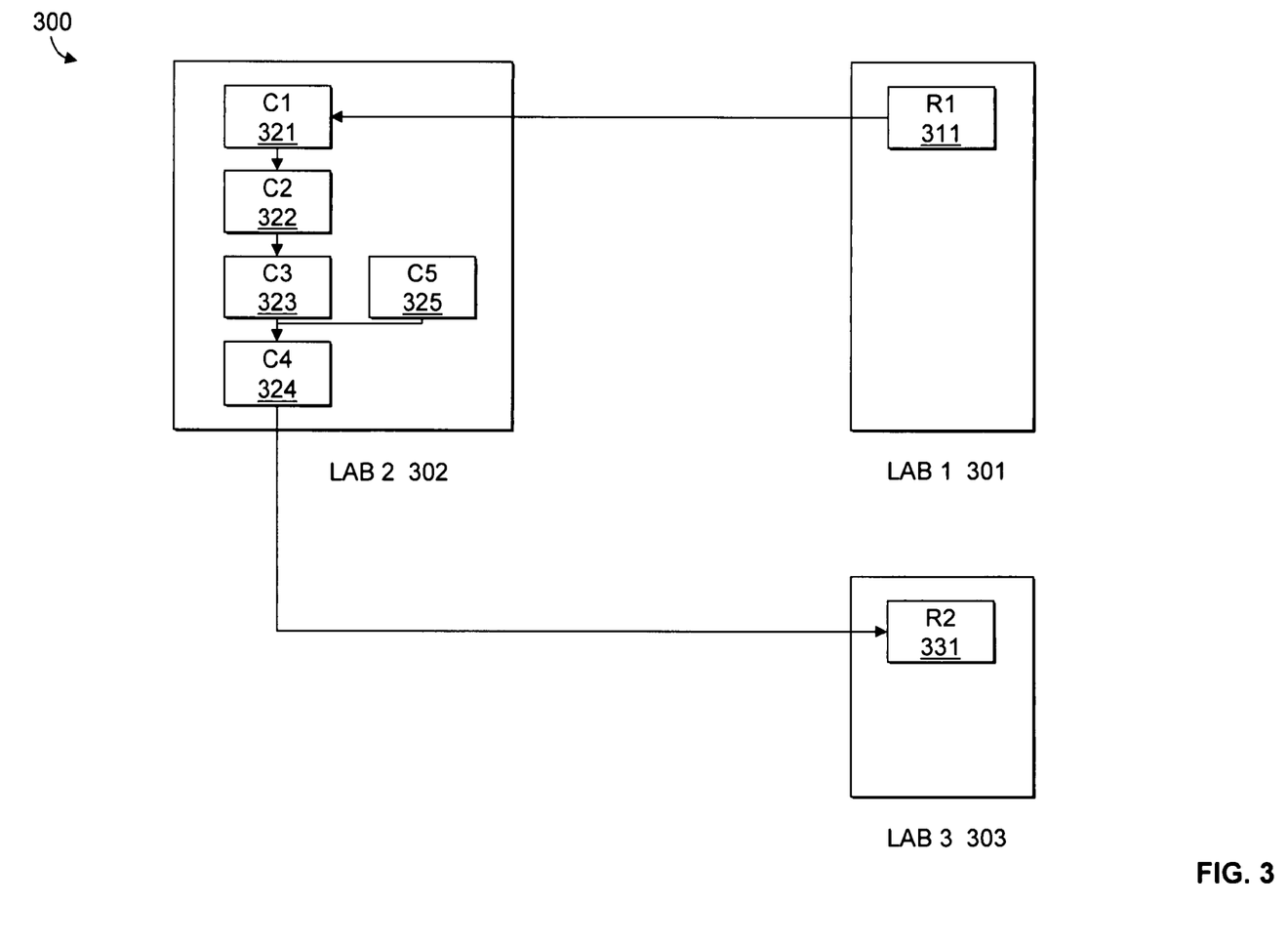
FIG. 3 illustrates an example of an instance where compound duplication may be beneficial according to an embodiment of the present invention.

FIG. 3 illustrates an example of an instance where compound duplication may be beneficial according to an embodiment of the present invention. In this example, a target 300 includes a plurality of LABs 301-303. Each of the LABs includes a plurality of components implemented by logic elements. LAB 1 301 includes a registered logic element R1 311. LAB 2 302 includes combinational logic elements C1-C5 321-325. LAB 3 303 includes registered logic element R2 331. It should be appreciated that other logic elements may reside in each of the LABs but are not illustrated for simplicity.

Current duplication procedures would consider duplicating logic element C4 324 from LAB 2 302 and placing the duplicate in LAB 3 303, as this may reduce the delay of the connection between the two logic elements. However, the current duplication procedure would find that the slack gain of this duplication and move is largely negated by the slack loss associated with the increased delay between logic element C3 323 and the duplicated element C4 324 that would arise if the duplication is carried out. Consequently, the duplication would be rejected. Compound duplication, according to an embodiment of the present invention, considers duplicating four logic elements in LAB 2 302, C1-C4 321-324, to LAB 3 303. With this duplication, if the slack change associated with the connection R1 311 and C1 321 and the slack change associated with the connection between C5 325 and C4 324 does not negate the slack gain on the connection between C4 324 and R2 331, the move is considered worthwhile. This illustrates one type of situation that a compound duplication procedure identifies and evaluates according to an embodiment of the present invention.

When performing compound duplication, either all components implemented by the candidate chain of logic elements are duplicated and placed in a destination LAB or none of the logic elements in the candidate chain should be duplicated as part of the procedure. Duplicating and moving only a subset of the candidate chain will generally not improve slack.

Figure 4:
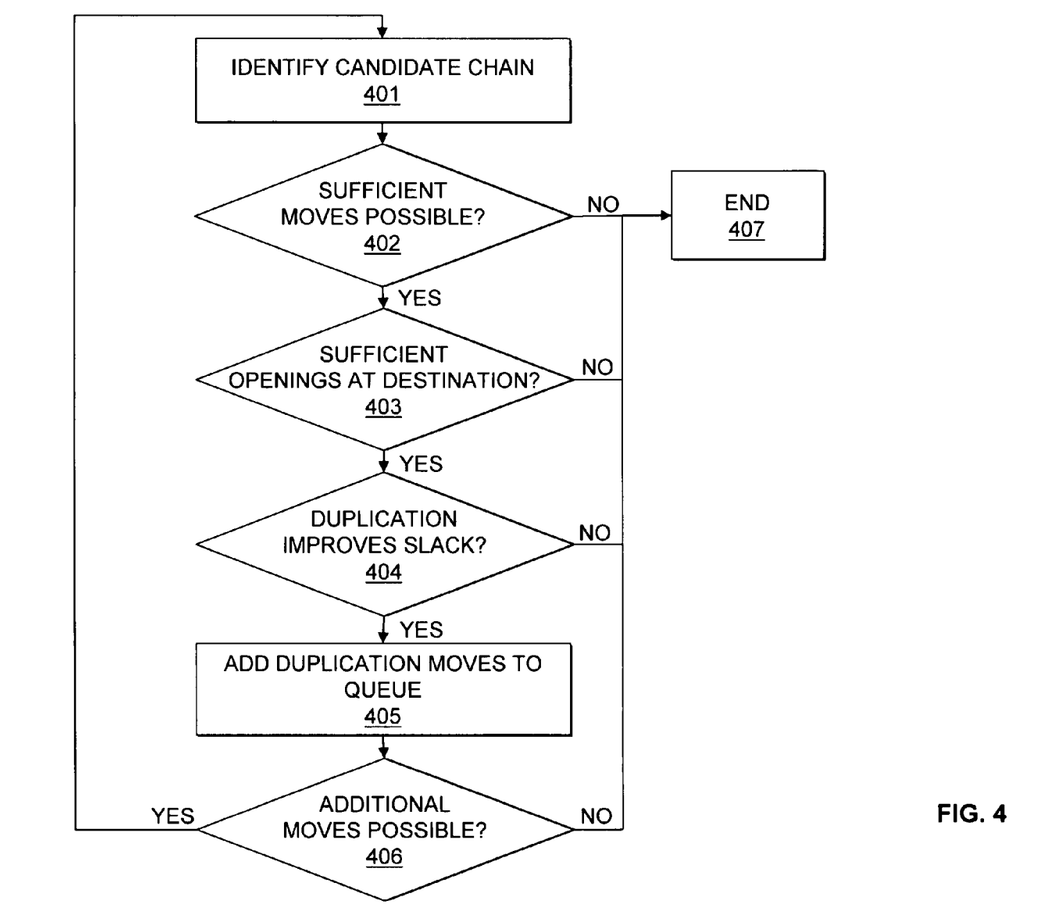
FIG. 4 is a flow chart illustrating a method for performing compound duplication according to an embodiment of the present invention.

FIG. 4 is a flow chart illustrating a method for performing compound duplication according to an embodiment of the present invention. The method of FIG. 4 may be performed at 104 shown in FIG. 1. At 401, a plurality of candidate LEs (a candidate chain) is identified that could potentially be duplicated together to provide slack gains. The duplicated candidate chain would be placed in a destination close to a component that it feeds (its sink).

At 402, it is determined whether a sufficient number of duplications can be performed to support duplicating the candidate chain identified at 401. According to an embodiment of the present invention, the sufficient number of duplications equals the number of candidate LEs identified at 401. A limit on how many compound duplication operations can be performed is set to prevent the procedure from consuming too much time and too many resources. According to an embodiment of the present invention, the limit is set to a threshold value which is decremented by the number of LEs in a candidate chain every time 402 is performed. The total number of compound duplication operations performed for the system cannot exceed the threshold value. If a sufficient number of duplications can be performed, control proceeds to 403. If a sufficient number of duplications cannot be performed, control proceeds to 406.

At 403, it is determined whether a sufficient number of openings are present at a destination to support duplication of the candidate chain. According to an embodiment of the present invention, the destination is the LAB where the sink resides. Alternatively, the destination may be a LAB in a location nearby where the sink resides. If a sufficient number of openings are present at the destination, control proceeds to 404. If a sufficient number of openings are not present, control proceeds to 406.

At 404, it is determined whether duplicating the candidate chain improves the overall slack of the system. According to an embodiment of the present invention, it is determine whether the most critical connection associated with the candidate chain will have a positive slack gain with the duplication. If duplicating the candidate chain improves the overall slack of the system, control proceeds to 405. If duplicating the candidate chain does not improve the overall slack of the system, control proceeds to 406.

At 405, the duplication moves for the candidate chain are added to a queue. According to an embodiment of the present invention, a queue of LEs to be duplicated and moved is kept. In an embodiment where compound duplication is performed with traditional duplication, the candidate chains identified are placed at the top of the queue in a position of higher priority to allow priority in duplication over traditional duplication candidates. Control may return back to 401 if the limit on compound duplication operations has not been exceeded.

At 406, it is determined whether additional moves are possible. According to an embodiment of the present invention, the limit described at 402 is checked to determine whether it has been reached. If additional moves are possible, control returns to 401. If additional moves are not possible, control proceeds to 407.

At 407, control terminates the procedure.

Figure 5:
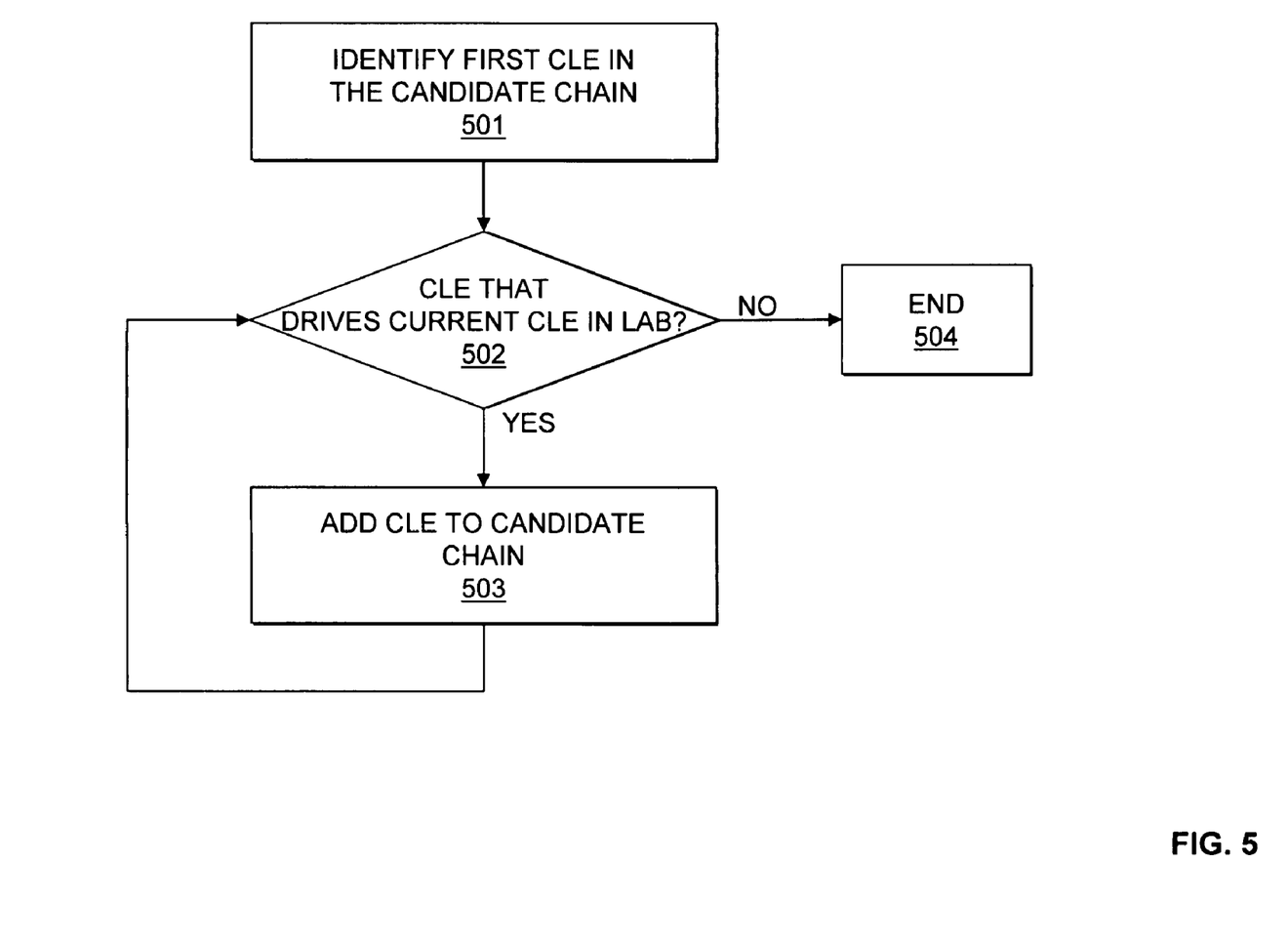
FIG. 5 is a flow chart illustrating a method for identifying a candidate chain of logic elements to duplicate according to an embodiment of the present invention.

FIG. 5 is a flow chart illustrating a method for identifying a candidate chain of logic elements to duplicate according to an embodiment of the present invention. The method illustrated in FIG. 5 may be performed at 401 shown in FIG. 4. At 501, a first combinational logic element (CLE) that feeds a registered logic element in a different LAB is identified. The first combinational logic element is the first logic element in the candidate chain and is designated the current combinational logic element.

At 502, it is determined whether a combinational logic element that drives the current combinational logic element being evaluated and that resides in a same LAB as the current combinational logic element exists. If the combinational logical element exists, control proceeds to 503. If the combinational logic element does not exist, control proceeds to 504.

At 503, control adds the combinational logic element identified at 502 to the candidate chain. The combinational logic element identified at 502 is designated as the current combinational logic element. Control returns to 502.

At 504, control terminates the process.

Figure 6:
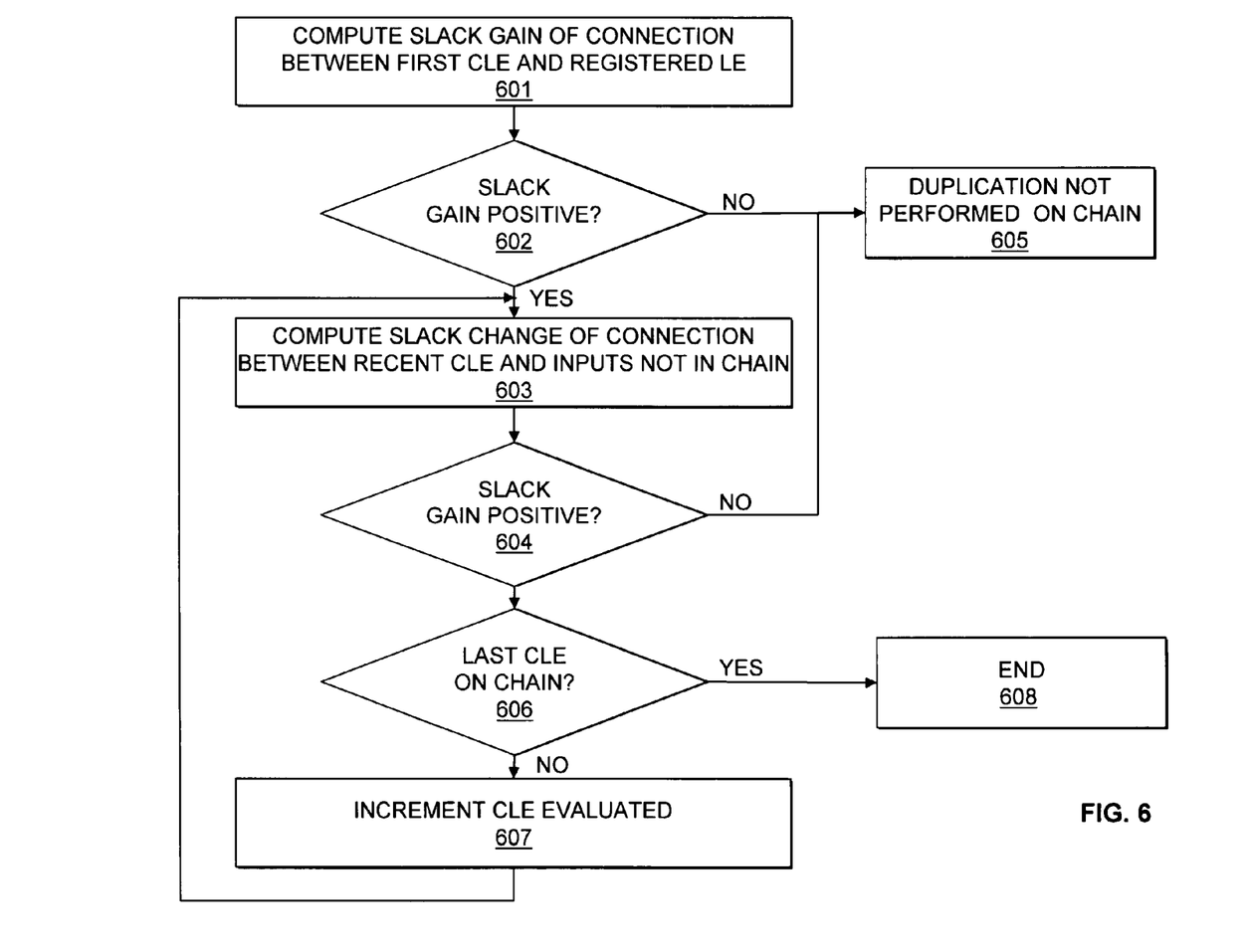
FIG. 6 is a flow chart illustrating a method for evaluating duplication of a candidate chain according to an embodiment of the present invention.

FIG. 6 is a flow chart illustrating a method for evaluating the duplication of a candidate chain according to an embodiment of the present invention. The method illustrated in FIG. 6 may be performed at 405 shown in FIG. 4. At 601, the slack gain associated with the connection between the first combinational logic element in the candidate chain and the registered logic element is computed. The first combinational logic element is designated as the current combinational logic element.

At 602, it is determined whether the slack gain is positive. If the slack gain is positive, control proceeds to 603. If the slack gain is negative, control proceeds to 605.

At 603, the slack associated with connections between the current combinational logic element and its inputs outside the candidate chain is computed.

At 604, it is determined whether the slack is positive. If the slack is not positive, control proceeds to 606. If the slack is positive, control proceeds to 606.

At 605, duplication of the candidate chain is not performed.

At 606, it is determined whether the current combinational logic is the last combinatorial logic element on the candidate chain. If the current combinatorial logic is not the last combinatorial logic element on the candidate chain, control proceeds to 607. If the current combinatorial logic is the last combinatorial logic element on the candidate chain, control proceeds to 608.

At 607, the combinatorial logic element on the candidate chain is designated as the current combinatorial logic element. Control returns to 603.

At 608, control terminates the process. According to an embodiment of the present invention, a decision to add duplication moves of the candidate chain to a queue may be made. According to an alternate embodiment of the present invention, the results generated at 601 and 603 may be further evaluated with a cost function to determine whether to add duplication moves of the candidate chain to a queue.

It should be appreciated that, compound duplication may be performed on logic elements other than combinational logic elements. In one embodiment, registered logic elements may be included in a candidate chain. In this embodiment, analysis of the slack of the system is modified to first identify how many register-to-register paths are affected by the move. The same slack analysis may then be performed on the path. If a cost function is used, the cost function values associated with the affected paths may be combined to make a decision on whether to perform compound duplication on the candidate chain.

FIGS. 1, and 4-6 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Figure 7:
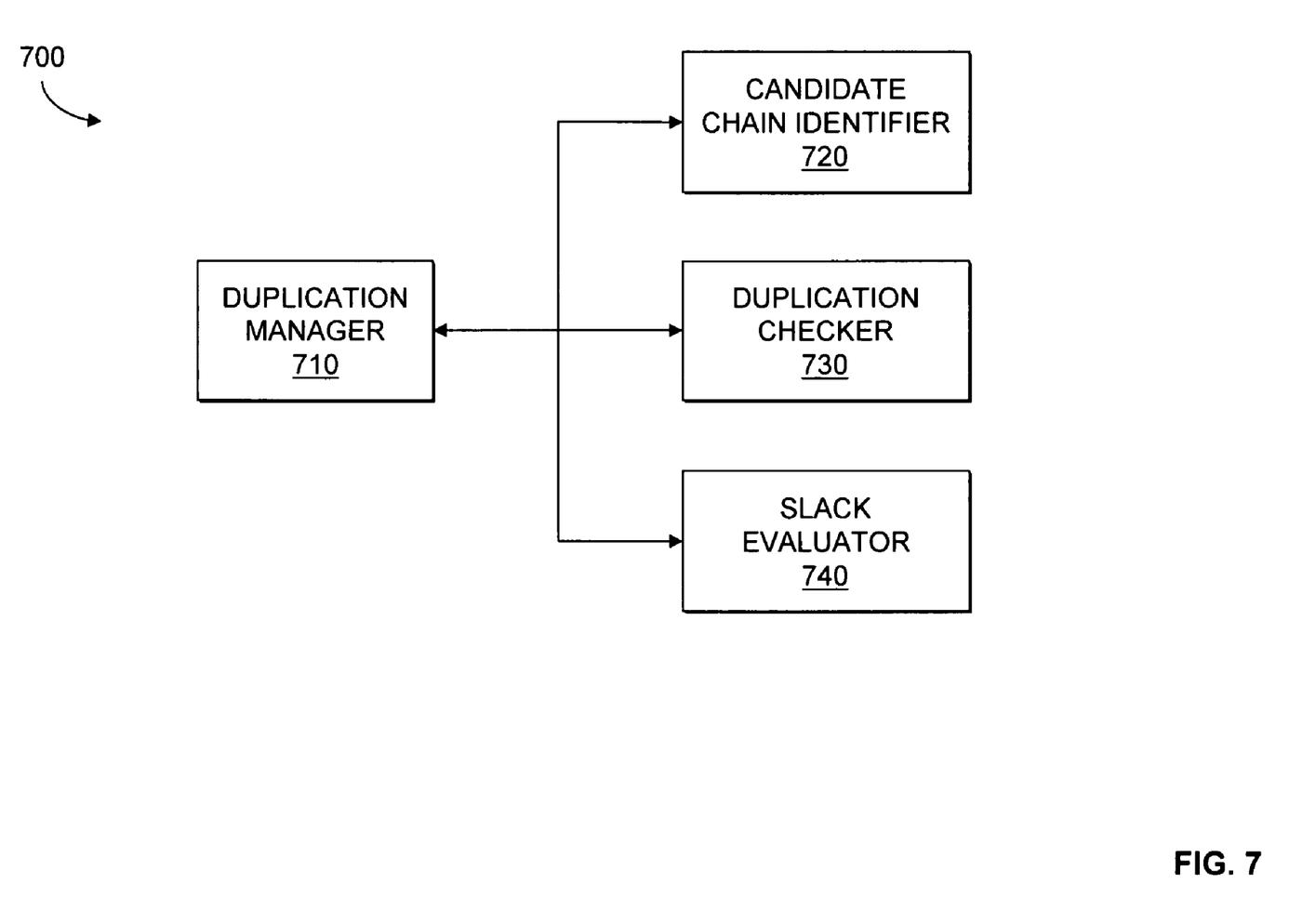
FIG. 7 is a block diagram illustrating a compound duplication unit according to an embodiment of the present invention.

FIG. 7 is a block diagram illustrating a compound duplication unit 700 according to an embodiment of the present invention. The compound duplication unit 700 may be implemented in an EDA tool. The compound duplication unit 700 includes a duplication manager 710. The duplication manager 710 interfaces with and transmits information between other modules in the duplication manager 710.

The compound duplication unit 700 includes a candidate chain identifier 720. The candidate chain identifier 720 identifies a candidate chain that includes a plurality of LEs that could potentially be moved together to provide slack gains. The candidate chain would be moved to a destination close to a component that the candidate chain feeds or its sink. According to an embodiment of the compound duplication unit 700, the candidate chain identifier 720 performs the procedure illustrated in FIG. 5.

The compound duplication unit 700 includes a duplication checker 730 to determine whether duplication of the candidate chain is possible. According to an embodiment of the compound duplication unit 700, the duplication checker 730 determines whether the number of duplications required for duplicating the candidate chain can be supported. The number of duplications that may be performed may be set to a threshold value. The duplication checker 730 may check to see whether this threshold value will been exceeded by duplicating the candidate chain. The duplication checker 730 may also determine whether a sufficient number of openings or resources are present at a destination to support duplication of the candidate chain. According to an embodiment of the present invention, the destination may be a LAB where the sink resides or a LAB near where the sink resides.

The compound duplication unit 700 includes a slack evaluator 740. The slack evaluator 740 determines whether duplicating the candidate chain improves the overall slack of a system. According to an embodiment of the compound duplication unit 700, it is determine whether the most critical connection associated with the candidate chain will have a positive slack gain with the duplication. According to an embodiment of the present invention, the slack evaluator 740 may perform the procedure illustrated in FIG. 6.

Embodiments of the present invention (e.g. exemplary procedures described with respect to FIGS. 1, and 4-6) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing field programmable gate arrays (FPGAs), comprising:
   identifying a plurality of components to duplicate in response to slack values associated with connections to the components in placement locations and adding duplication moves for the plurality of components to a queue;
   identifying a single component to duplicate in response to slack values associated with connections to the component in placement locations and adding duplication moves for the component to the queue; and
   prioritizing queue entries such that the plurality of components are duplicated before the single component.

2. The method of claim 1, wherein the duplicated components are implemented by logic elements (LE) on a same logic array block (LAB) on the target device.

3. The method of claim 1, further comprising:
   synthesizing a design for the system;
   mapping components in the design onto resources on the target device; and
   determining the placement locations for the components on the target device.

4. The method of claim 1, further comprising routing of the system to provide interconnections to the plurality of components that are duplicated.

5. The method of claim 1, wherein identifying the plurality of components to duplicate comprises identifying a candidate chain of logic elements to duplicate.

6. The method of claim 5, wherein identifying the candidate chain comprises identifying a first logic element that is a non-registered logic element that feeds a registered logic element in a different logic array block (LAB).

7. The method of claim 6, further comprising identifying logic elements that drive the first logic element and that reside in a same LAB.

8. The method of claim 5, further comprising determining whether duplicating the plurality of components exceeds a threshold number of duplications.

9. The method of claim 5, further comprising determining whether resources exist to support duplication of the chain of logic elements.

10. The method of claim 5, further comprising determining whether the duplication improves slack on the target device.

11. A machine-readable medium having stored thereon sequences of instructions, the sequences of instructions including instructions which, when executed by a processor, causes the processor to perform:
   identifying a plurality of components to duplicate in response to slack values associated with connections to the components in placement locations and adding duplication moves for the components to a queue;
   identifying a single component to duplicate in response to slack values associated with connections to the component in placement locations and adding duplication moves for the component to the queue; and prioritizing queue entries such that the plurality of components are duplicated before the single component.

12. The machine-readable medium of claim 11, wherein the duplicated components are implemented by logic elements (LE) on a same logic array block (LAB) on the target device.

13. The machine-readable medium of claim 11, wherein identifying the plurality of components to duplicate comprises identifying a candidate chain of logic elements to duplicate.

14. The machine-readable medium of claim 13, wherein identifying the candidate chain comprises identifying a first logic element that is a non-registered logic element that feeds a registered logic element in a different logic array block (LAB).

15. The machine-readable medium of claim 14, further comprising instructions which when executed by the processor, causes the processor to perform identifying logic elements that drive the first logic element and that reside in a same LAB.

16. The machine-readable medium of claim 13, further comprising instructions which when executed by the processor, causes the processor to perform further comprising determining whether the duplication improves slack on the target device.

17. A compound duplication unit, comprising:
a candidate chain identifier to identify a plurality of components to duplicate in response to slack values associated with connections to the components in placement locations and adding duplication moves for the components in a queue and to identify a single component to duplicate in response to slack values associated with connections to the component in placement locations and adding duplication moves for the component to the queue; and a duplication manager to prioritize queue entries such that the plurality of components are duplicated before the single component.

18. The apparatus of claim 17, wherein the plurality of components to duplicate are to be implemented by logic elements (LE) on a same logic array block (LAB) on the target device.

19. The apparatus of claim 17, wherein the candidate chain identifier identifies a first logic element that is a non-registered logic element that feeds a registered logic element in a different logic array block (LAB).

20. The apparatus of claim 19, wherein the candidate chain identifier identifies logic elements that drive the first logic element and that reside in a seine LAB.

21. The apparatus of claim 17, further comprising a duplication checker to determine whether resources exist to support duplication of the chain of logic elements.

22. The apparatus of claim 17, further comprising a slack evaluator to determine whether the duplication improves slack on the target device.

* * * * *